United States Patent
Cheng et al.

(10) Patent No.: US 9,538,582 B2
(45) Date of Patent: Jan. 3, 2017

(54) WARPAGE CONTROL IN THE PACKAGING OF INTEGRATED CIRCUITS

(75) Inventors: Ming-Da Cheng, Jhubei (TW);
Hsiu-Jen Lin, Zhubei (TW);
Cheng-Ting Chen, Taichung (TW);
Wei-Yu Chen, Taipei (TW); Chien-Wei Lee, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 824 days.

(21) Appl. No.: 13/559,318

(22) Filed: Jul. 26, 2012

(65) Prior Publication Data

US 2014/0027431 A1 Jan. 30, 2014

(51) Int. Cl.
*B23K 31/02* (2006.01)
*H01L 21/00* (2006.01)
*H05B 3/02* (2006.01)
*H01L 21/677* (2006.01)
*H01L 21/683* (2006.01)
*H01L 23/00* (2006.01)

(52) U.S. Cl.
CPC ........... *H05B 3/02* (2013.01); *H01L 21/67721* (2013.01); *H01L 21/6838* (2013.01); *H01L 24/75* (2013.01); *H01L 24/81* (2013.01); *H01L 2224/131* (2013.01); *H01L 2224/16225* (2013.01); *H01L 2224/16227* (2013.01); *H01L 2224/7598* (2013.01); *H01L 2224/75744* (2013.01); *H01L 2224/81191* (2013.01); *H01L 2224/81815* (2013.01); *H01L 2224/97* (2013.01); *H01L 2924/3511* (2013.01); *Y10T 29/41* (2015.01)

(58) Field of Classification Search
None
See application file for complete search history.

(56) References Cited

U.S. PATENT DOCUMENTS

| | | | |
|---|---|---|---|
| 5,447,886 A * | 9/1995 | Rai | 228/180.22 |
| 5,802,856 A | 9/1998 | Schaper et al. | |
| 6,364,196 B1 * | 4/2002 | Wood et al. | 228/41 |
| 6,432,744 B1 | 8/2002 | Amador et al. | |
| 7,455,213 B2 * | 11/2008 | Nishiyama | H01L 21/6835 228/180.22 |

(Continued)

FOREIGN PATENT DOCUMENTS

| | | |
|---|---|---|
| CN | 102386114 A | 3/2012 |
| TW | 200605245 | 2/2006 |

(Continued)

*Primary Examiner* — Devang R Patel
(74) *Attorney, Agent, or Firm* — Slater Matsil, LLP (57) ABSTRACT

A method includes placing a first package component over a vacuum boat, wherein the vacuum boat comprises a hole, and wherein the first package component covers the hole. A second package component is placed over the first package component, wherein solder regions are disposed between the first and the second package components. The hole is vacuumed, wherein the first package component is pressed by a pressure against the vacuum boat, and wherein the pressure is generated by a vacuum in the hole. When the vacuum in the hole is maintained, the solder regions are reflowed to bond the second package component to the first package component.

20 Claims, 6 Drawing Sheets

(56) References Cited

U.S. PATENT DOCUMENTS

| | | | |
|---|---|---|---|
| 7,612,386 | B2 | 11/2009 | Ng et al. |
| 8,042,727 | B2 | 10/2011 | Shirai et al. |
| 8,104,666 | B1 | 1/2012 | Hwang et al. |
| 9,010,617 | B2 | 4/2015 | Yu et al. |
| 2003/0047527 | A1* | 3/2003 | Master et al. ............. 211/41.18 |
| 2005/0034302 | A1* | 2/2005 | Hosotani et al. ............... 29/840 |
| 2006/0208041 | A1* | 9/2006 | MacKay et al. .............. 228/254 |
| 2007/0141751 | A1* | 6/2007 | Mistry .................. H01L 21/561 438/109 |
| 2008/0169282 | A1 | 7/2008 | Sorabji et al. |
| 2009/0137084 | A1 | 5/2009 | Kida |
| 2012/0018494 | A1* | 1/2012 | Jang et al. .................... 228/125 |
| 2012/0175403 | A1 | 7/2012 | Yu et al. |
| 2012/0291950 | A1 | 11/2012 | Sugiyama et al. |

FOREIGN PATENT DOCUMENTS

| | | |
|---|---|---|
| TW | 200615074 | 5/2006 |
| TW | 201137994 | 11/2011 |
| TW | 201230215 A | 7/2012 |
| TW | 201230260 | 7/2012 |

\* cited by examiner

WARPAGE CONTROL IN THE PACKAGING OF INTEGRATED CIRCUITS

BACKGROUND

In the packaging of integrated circuits, device dies or packages are packaged onto package substrates, which include metal connections that are used to route electrical signals between opposite sides of the package substrates. The device dies may be bonded onto one side of a package substrate using flip chip bonding, and a reflow is performed to melt the solder balls that interconnect the dies and the package substrate.

The package substrates may use materials that can be easily laminated. In addition, organic materials may be used as the dielectric materials of the package substrate. These materials, however, are prone to warpage caused by elevated temperatures used in the reflow of the solder. Furthermore, during the bonding process, since the device dies and the package substrates have significantly different Coefficients of Thermal Expansion (CTEs), the warpage in the dies and the package substrates is worsened. For example, the silicon in the device dies has a CTE close to about 3.2, while the package substrates may have a CTE between about 17 and 10, or even higher. The warpage in the package substrates may cause irregular joints and/or bump cracks. As a result, the yield of the packaging process is adversely affected.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Methods for forming packages are provided in accordance with embodiments. The variations of the embodiments are discussed. Throughout the various views and illustrative embodiments, like reference numbers are used to designate like elements. It is appreciated that the embodiments such as what are shown in FIGS. 1A through 4 are exemplary embodiments, and more embodiments may be developed based on the teaching of the exemplary embodiments.

Figure 1A:
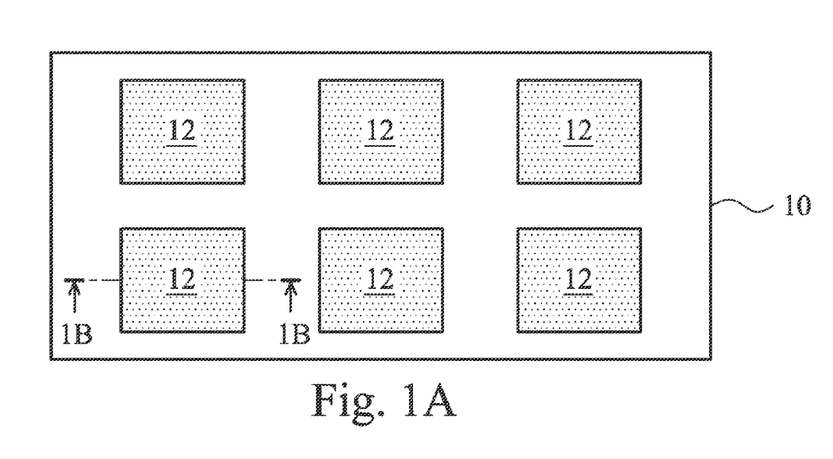
FIGS. 1A and 1B include a top view and a cross-sectional view of a package substrate strip in accordance with some embodiments.
Figure 1B:
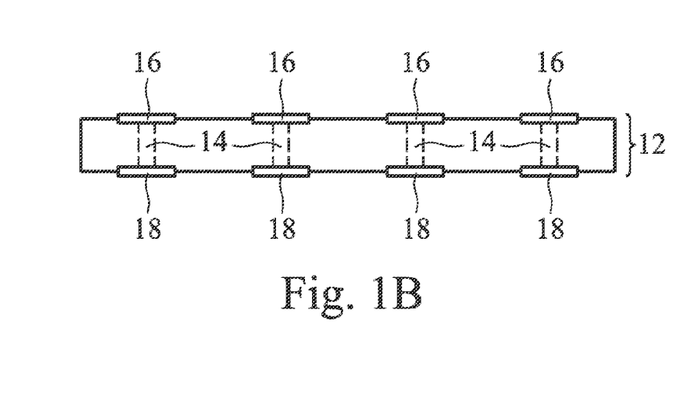

FIGS. 1A and 1B illustrate a top view and a cross-sectional view, respectively, of an exemplary package component 10, on which a bonding process in accordance with exemplary embodiments is performed. Package component 10 may be a package substrate strip, and hence is referred to as package substrate strip 10 hereinafter, although package component 10 may be another type of package component such as an interposer. Package substrates 12 may be laminate substrates, which include a plurality of dielectric films laminated together. In accordance with embodiments, package substrate strip 10 includes a plurality of package substrates 12 that are identical to each other. In some embodiments, package substrates 12 are distributed uniformly throughout package substrate strip 10, and may have a pattern of an array. In other embodiments, package substrates 12 are disposed as a plurality of groups, with the inter-group spacing between the groups greater than the inner-group spacing between package substrates 12 that are in the same group.

FIG. 1B schematically illustrates a cross-sectional view of one of package substrates 12, wherein the cross-sectional view is obtained from the plane crossing line 1B-1B in FIG. 1A. A plurality of connectors 16, which may be pre-solder regions, metal pads, or non-reflowable metal bumps, is formed on a side of package substrate 12. Metal features 16 are electrically coupled to metal features such as bond pads 18 on the opposite side of package substrate 12. Dashed lines 14 represent the electrical features that couple features 16 to features 18, wherein the electrical features may include a plurality of metal lines and vias that interconnect the metal lines.

Figure 2A:
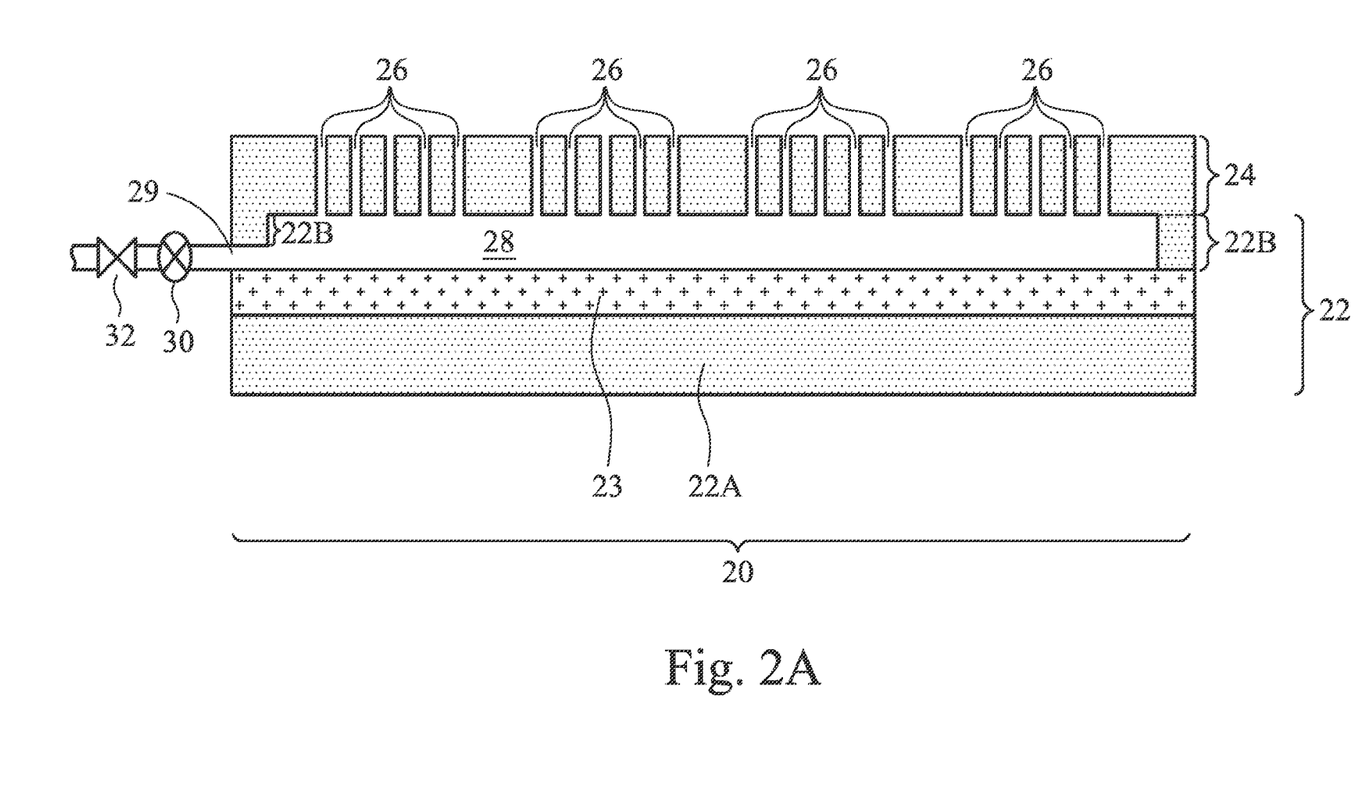
FIGS. 2A and 2B are cross-sectional views of exemplary vacuum boats in accordance with exemplary embodiments.
Figure 2B:
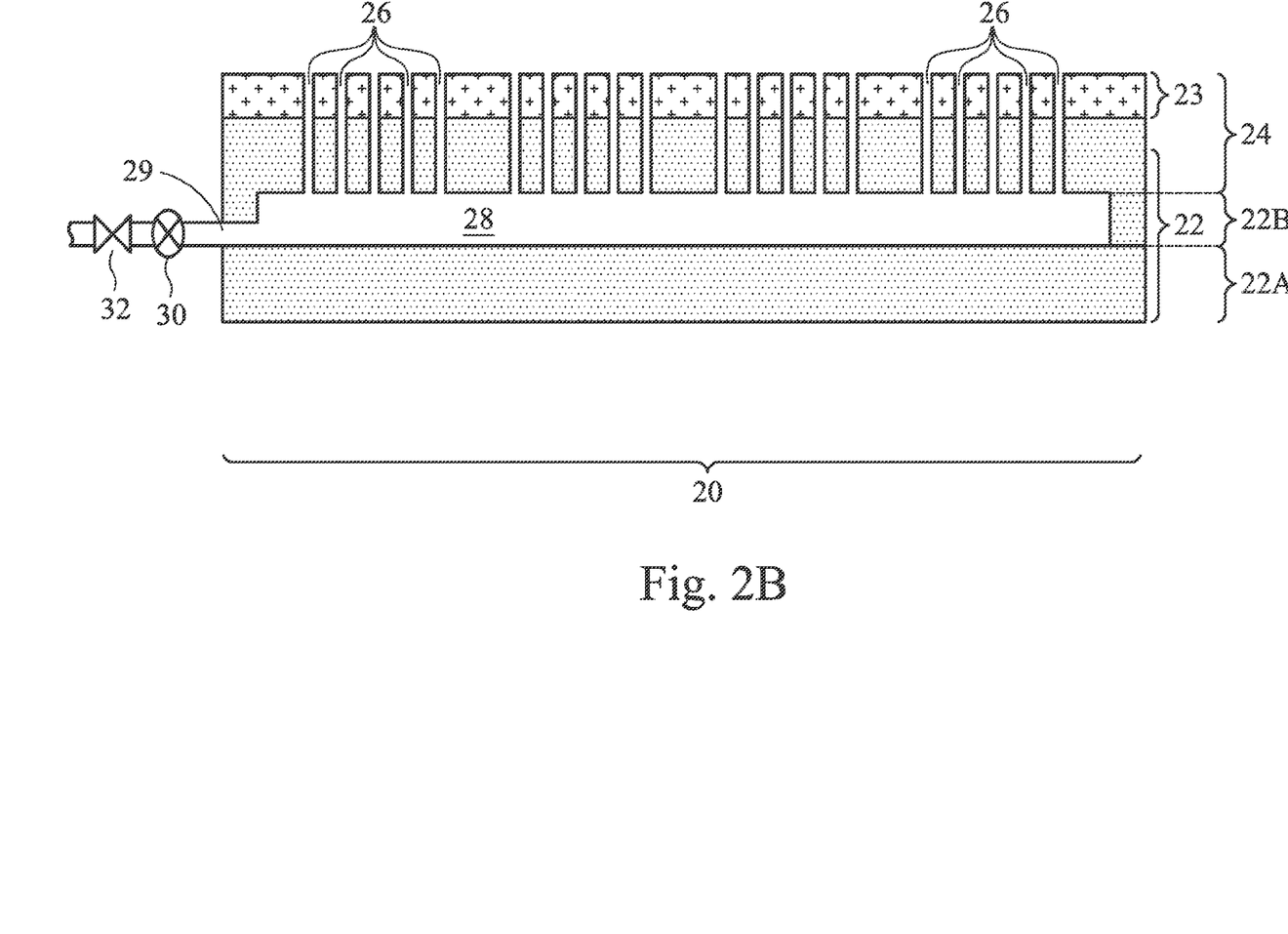

FIGS. 2A and 2B illustrate cross-sectional views of vacuum boat 20 in accordance with exemplary embodiments. Vacuum boat 20 includes base 22, which further includes lower portion 22A, upper portion 22B, and air-penetration layer 24 over and connected to upper portion 22B. Base portion 22A is underlying and overlapped by air-penetration layer 24, and is vertically spaced apart from air-penetration layer 24 by air passage 28, which is a space filled with air (or vacuumed). Base portion 22B forms a ring that encircles air passage 28. Furthermore, base portion 22B joins air-penetration layer 24 with no gap therebetween. Base 22 may be formed of non-porous materials that can effectively prevent air from penetrating through. Air passage 28 may have a shape that is similar to the top-view shape (such as a rectangular shape) of package substrate strip 10. In some exemplary embodiments, base portions 22A and 22B and air-penetration layer 24 are formed of a rigid material that is strong enough to maintain vacuum in air passage 28, so that vacuum boat 20 is not crushed by the vacuum. For example, base portions 22A and 22B and air-penetration layer 24 may be formed of a metal or a metal alloy including copper, aluminum, stainless steel, or the like. Alternatively, base portions 22A and 22B and air-penetration layer 24 are formed of a ceramic or ceramics.

Referring again to FIGS. 2A and 2B, base 22 may also include thermal insulation layer 23, which is formed of a thermal insulating material. Thermal conductivity of thermal insulation layer 23 may be lower than about 1 W/K·m, for example. Thermal insulation layer 23 may sustain the melting temperatures (or temperatures slightly higher) of solders without being damaged. For example, thermal insulation layer 23 is configured to sustain temperatures higher than about 200° C., or higher than about 230° C. In some exemplary embodiments, thermal insulation layer 23 is formed of Teflon.

Figure 4:
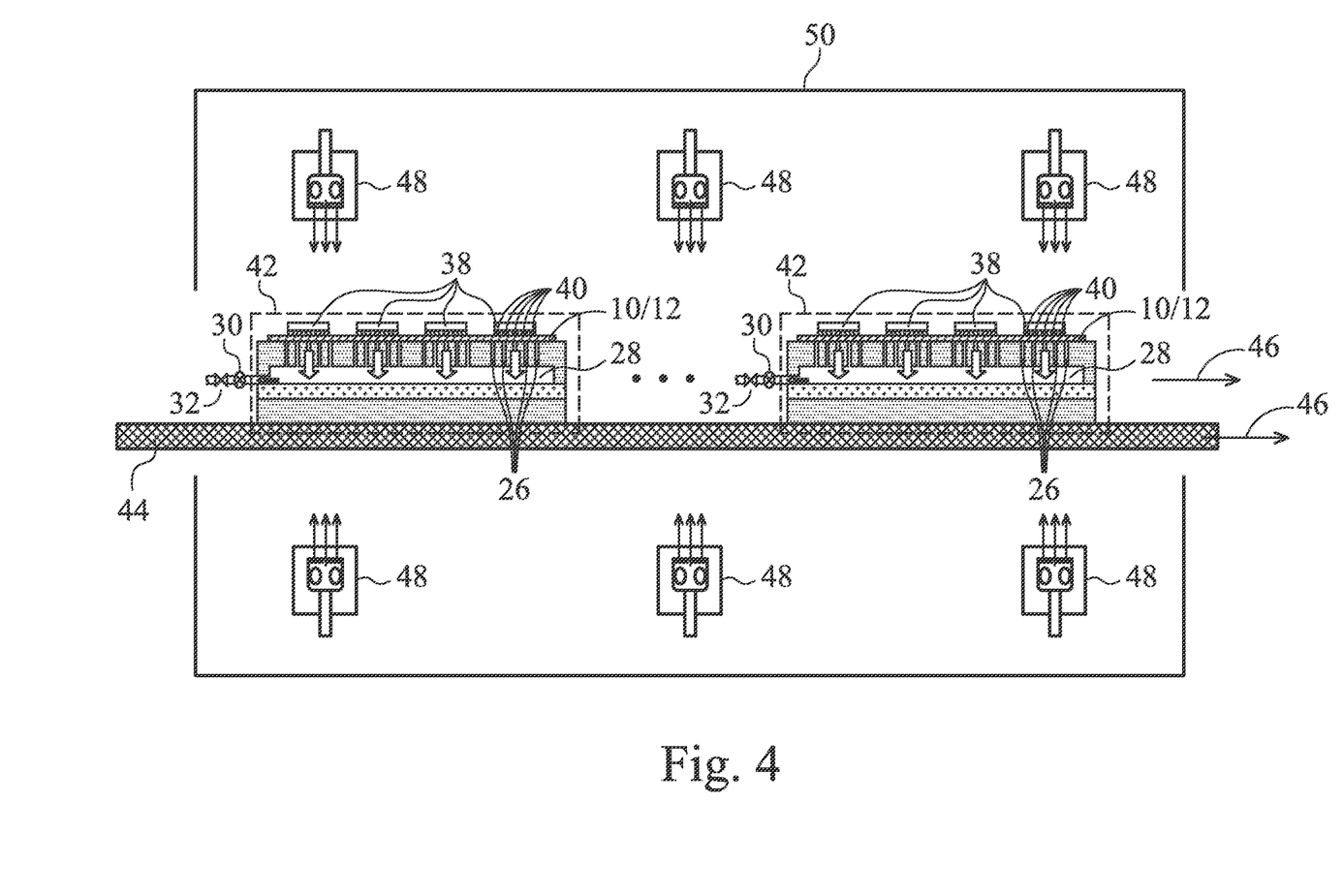
FIG. 4 illustrates a cross-sectional of a packaging process, wherein the vacuum boat and the package components that are to be bonded go through a reflow process.

Referring to FIG. 2A, thermal insulation layer 23 has the function of preventing the heat absorbed by air-penetration layer 24 to be conducted to base portion 22A during the reflow process shown in FIG. 4. If thermal insulation layer 23 is not included, base portion 22A, due to its large volume, may absorb too much heat during the reflow process in FIG. 4, and cause adverse reduction in the temperature of the package components 12 and 38 and solder regions 40 (FIG. 4).

Figure 3:
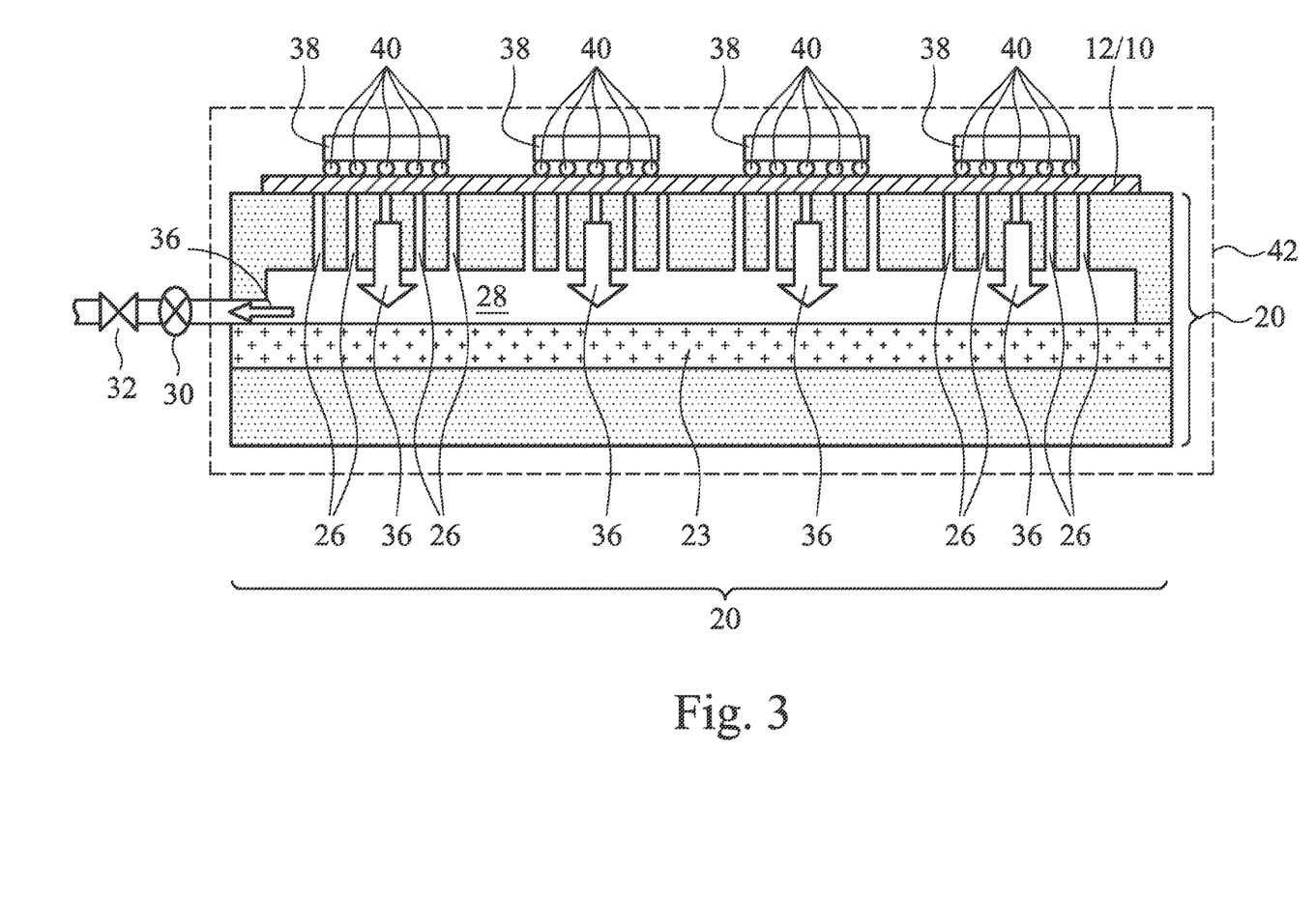
FIG. 3 illustrates a plurality of package components placed over another package component.

As shown in FIGS. 2A and 2B, air-penetration layer 24 may include a plurality of holes 26. Therefore, air passage 28 is connected to, and may exchange air with, external environment (for example, open air) through holes 26. Air passage 28 is also connected to outlet 29, which may be connected to external environment through pump 30 and valve 32. Outlet 29 is used to vacuum air passage 28 and holes 26 (when package substrate strip 10 is placed on air-penetration layer 24, as shown in FIGS. 3 and 4) to generate a vacuum environment. Valve 32 is also used to release vacuum by allowing air to flow into air passage 28 and holes 26. In some embodiments, an additional valve (not shown) may be connected to air passage 28, and hence valve 32 may be used for vacuuming, while the additional valve may be used for releasing the vacuum.

FIG. 2B illustrates a cross-sectional view of vacuum boat 20 in accordance with alternative embodiments. In these embodiments, thermal insulation layer 23 is formed as a top portion of air-penetration layer 24. Holes 26 are formed in thermal insulation layer 23, and penetrate into a bottom portion of air-penetration layer 24, which is below thermal insulation layer 23. The lower portion of air-penetration layer 24 may be formed of a rigid material such as a metal, a metal alloy, a ceramic, or the like, so that the lower portion provides adequate mechanical support to thermal insulation layer 23. When vacuum boat 20 in FIG. 2B is used to bond package substrate strip 10 and package components 38 (FIGS. 3 and 4), package substrate strip 10 may be in contact with thermal insulation layer 23 in these embodiments, and hence the heat in package substrate strip 10 and solder regions 40 (FIGS. 3 and 4) is not conducted into the base 22 of vacuum boat 20.

Figure 2C:
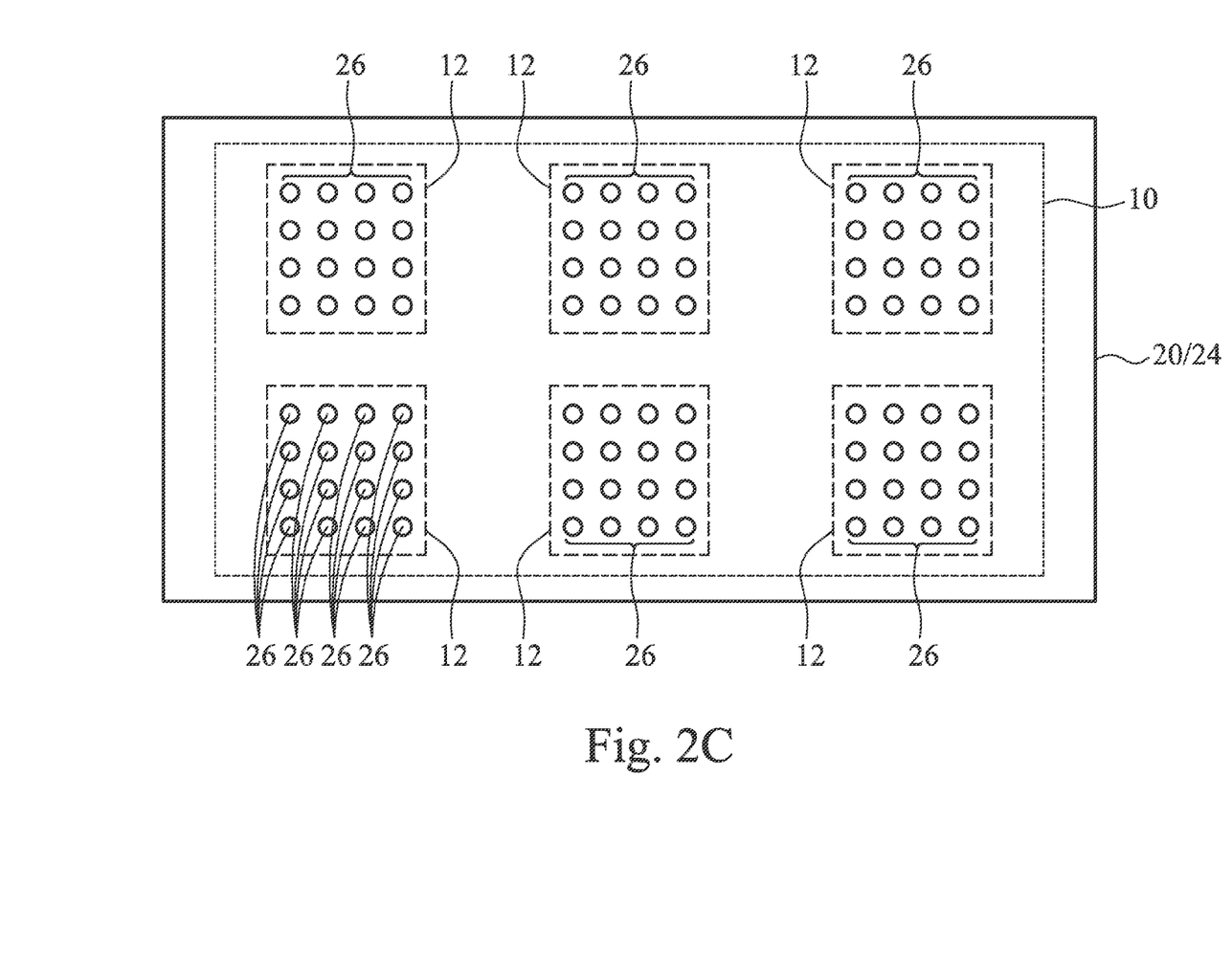
FIG. 2C is a top view of the vacuum boats in FIGS. 2A and 2B.

FIG. 2C illustrates an exemplary top view of the structure shown in FIGS. 2A and 2B. It illustrates a plurality of holes 26 distributed throughout air-penetration layer 24. The plurality of holes 26 may be distributed substantially uniformly, for example, as an array, or in any other pattern such as a radius pattern, a spiral pattern, or the like. FIG. 2C also illustrates package substrate strip 10 that is to be placed on air-penetration layer 24, wherein package substrate strip 10 is illustrated using dotted lines. Air-penetration layer 24 may have a rectangular top-view shape, although other shapes may also be adopted.

In FIGS. 3 and 4, although pump 30 and or valve 32 are illustrated as being attached to vacuum boat 20, pump 30 and valve 32 may be connected to vacuum boat 20 before the reflow process as shown in FIG. 4, and disconnected from vacuum boat 20 after the reflow process. Furthermore, in FIGS. 3 and 4, the vacuum boat 20 in FIG. 2A is illustrated to explain the concept of the embodiments. The vacuum boat 20 in FIGS. 3 and 4, however, may also adopt the structure shown in FIG. 2B.

Referring to FIG. 3, package substrate strip 10 is placed over vacuum boat 20. Holes 26 are covered by, and sealed by, package substrate strip 10. Pump 30 then evacuates the air in air passage 28 and holes 26 to generate vacuum therein. Arrows 36 represent the direction that the air is evacuated. During the vacuuming, a downward force is applied to package substrate strip 10 due to the air pressure caused by the vacuum, and hence package substrate strip 10 is flattened. During the vacuuming, the pressure in air passage 28 and holes 26 may be at any value lower than an atmosphere. For example, the pressure in air passage 28 may be lower than about 50 percent of one atmosphere. Package components 38 are placed over package substrate 12, for example, with a one-to-one correspondence. Solder regions 40 are disposed between package substrates 12 and package components 38. The placement of package components 38 on package substrate strip 10 may be performed before or after the vacuuming is started. In some embodiments, package components 38 are dies (such as device dies comprising CMOS devices), packages, or the like. Throughout the description, vacuum boat 20, package substrates 12, and package components 38 in combination are referred to as reflow unit 42.

Next, as shown in FIG. 4, reflow unit 42 goes through a reflow process, so that solder regions 40 are reflowed, and hence package components 38 are bonded to the respective underlying package substrates 12. In some exemplary embodiments, the reflow is performed using a convection-type reflow apparatus, as shown in FIG. 4. For example, the reflow process may be performed in chamber 50. Reflow unit 42 is transferred by conveyor belt 44 into and out of chamber 50. During the reflow, conveyor belt 44 and reflow unit 42 move forward, as indicated by arrows 46. It is appreciated that other types of reflow methods other than the convection-type reflow may also be used to perform the reflow, in accordance with alternative embodiments. As shown in FIG. 4, a plurality of reflow units 42 may be disposed on conveyor belt 44, and are transferred into and out of chamber 50 one by one. Reflow units 42 are removed from conveyor belt 44 after they are transferred out of chamber 50, and additional reflow units 42, which include package components 38 and package substrates 12 that have not bonded to each other yet, are placed on conveyor belt 44.

During the reflowing, conveyor belt 44 transfers reflow unit 42 through one or more heating zones, each including one or more heat sources 48 for heating solder regions 40. When reflow unit 42 is transferred passing heat sources 48, solder regions 40, which are between package components 38 and the underlying package substrates 12, are heated to a temperature higher than the melting temperature of solder regions 40, and hence solder regions 40 are molten. In some embodiments, heat sources 48 are disposed over and/or under reflow unit 42 (and conveyor belt 44). Heat sources 48 may be radiation-type heating sources such as infrared radiant sources, or may be configured to blow hot air to reflow unit 42. The arrows pointed away from heat sources 48 symbolize the radiated heat, the hot air, or the like.

Throughout the reflow process, pump 30 operates to maintain the air pressure on package substrates 12 through the generation of the vacuum. The pumping of air may be started at one of several time points. For example, the pumping may be started after package substrate strip 10 is placed on vacuum boat 20, and before or after the placement of package components 38. In alternative embodiments, the pumping may also be started after the placement of reflow unit 42 on conveyor belt 44, and before solder regions 40 are molten. In yet alternative embodiments, the pumping may also be started after the molten of solder regions 40, and before the solidification of solder regions 40. The vacuum is maintained until the reflow process ends. By then, solder regions 40 are cooled and at least substantially, or fully, solidify. Package components 38 are thus bonded to the underlying package substrates 12. The vacuum may then be released, for example, by allowing air to be conducted into air passage 28, which may be achieved through valve 32. Pump 30 may then be disconnected from vacuum boat 20.

In some embodiments, pumps 30 in different reflow units 42 may be separate pumps. In alternative embodiments, the illustrated pumps 30 may be the same pump that has a plurality of inlets, each connected to one of reflow units 42.

In the embodiments, during the reflow process, package substrates 12 are flattened by the pressure caused by the vacuum in air passage 28 and holes 26 (FIGS. 3 and 4). Accordingly, the warpage of package substrates 12, which warpage is caused by the difference in Coefficients of Thermal Expansion (CTEs) of different materials in package components 38 and package substrates 12, is substantially eliminated. The reliability of the resulting packages is improved.

In accordance with embodiments, a method includes placing a first package component over a vacuum boat, wherein the vacuum boat comprises a hole, and wherein the first package component covers the hole. A second package component is placed over the first package component, wherein solder regions are disposed between the first and the second package components. The hole is vacuumed, wherein the first package component is pressed by a pressure against the vacuum boat, and wherein the pressure is generated by a vacuum in the hole. When the vacuum in the hole is maintained, the solder regions are reflowed to bond the second package component to the first package component.

In accordance with other embodiments, a method includes placing a package substrate strip over a vacuum boat, wherein the vacuum boat includes a plurality of holes, and wherein the package substrate strip covers the plurality of holes. A plurality of package components is placed over the package substrate strip, wherein each of the plurality of package components is placed over one of package substrates in the package substrate strip. Air is pumped out of the plurality of holes to generate a pressure on the package substrate strip, wherein the pressure presses the package substrate strip against the vacuum boat. Solder regions between the plurality of package components and the package substrates are reflowed to bond the plurality of package components to the package substrates, wherein the step of pumping air is performed until the solder regions substantially solidify.

In accordance with yet other embodiments, a vacuum boat includes a base that includes an upper portion forming a ring, and a lower portion under the upper portion, wherein the upper portion is connected to edges of the lower portion. The vacuum boat further includes an air-penetration layer over and connected to the upper portion of the base. The air-penetration layer, the upper portion, and the lower portion enclose an air passage therebetween. A plurality of holes penetrates through the air-penetration layer, wherein the plurality of holes connects the air passage to an external environment. A thermal insulation layer is disposed over the lower portion of the base. An outlet is connected to the air passage.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    placing a package strip over a vacuum boat, wherein the vacuum boat comprises an air-penetration layer having a hole, an upper base portion, and a lower base portion, and wherein the package strip covers the hole;
    placing a package component over the package strip, wherein solder regions are disposed between the package strip and the package component;
    vacuuming the hole, wherein the package strip is pressed by a pressure against the vacuum boat, and wherein the pressure is generated by a vacuum in the hole;
    when the vacuum in the hole is maintained, reflowing the solder regions to bond the package component to the package strip; and
    insulating the first package strip from conducting heat to the lower base portion of the vacuum boat, wherein the lower base portion is below, and is vertically spaced apart from the air-penetration layer by a thermal insulation layer, and the thermal insulation layer does not have any hole for conducting air during the vacuuming.

2. The method of claim 1, wherein the step of vacuuming the hole is performed throughout an entirety of the step of reflowing, and wherein the vacuum is maintained until the solder regions substantially solidify.

3. The method of claim 1, wherein the step of reflowing is performed using a convection-type reflow process or an infrared (IR) heating process, with the vacuum boat and the package strip and the package component being transferred on a conveyor belt during the convection-type reflow process.

4. The method of claim 1, wherein the step of vacuuming the hole comprises connecting a pump to the vacuum boat, and the vacuuming is started when solder regions have been molten.

5. The method of claim 1, wherein the vacuum boat comprises a plurality of holes therein, and wherein during the step of vacuuming, the plurality of holes is vacuumed.

6. The method of claim 1, wherein the step of reflowing the solder regions to bond the package component to the package strip comprises simultaneously bonding a plurality of packages to the package strip, wherein the vacuum boat comprises a plurality of holes separated into a plurality of hole groups, with inter-group spacings between different groups being greater than inner-group spacings of holes in a same group, and wherein each of the plurality of packages overlaps one of the plurality of hole groups.

7. A method comprising:
    placing a package substrate strip over a vacuum boat, wherein the vacuum boat comprises a plurality of holes separated into a plurality of hole groups, with inter-group spacings between different groups being greater than inner-group spacings of holes in a same group;
    placing a plurality of package components over the package substrate strip, wherein each of the plurality of package components is placed over one of package substrates in the package substrate strip, wherein each of the package substrates fully covers one of the plurality of hole groups;

pumping air out of the plurality of holes to generate a pressure on the package substrate strip, wherein the pressure presses the package substrate strip against the vacuum boat;

insulating the package substrate strip from conducting heat to a lower portion of the vacuum boat, wherein the step of insulating is performed using a thermal insulation layer in the vacuum boat, wherein the thermal insulation layer is a top layer of the vacuum boat, with the plurality of holes penetrating through the thermal insulation layer, and wherein during the step of reflowing, the package substrate strip is in contact with the thermal insulation layer; and reflowing solder regions between the plurality of package components and the package substrates to bond the plurality of package components to the package substrates, wherein the step of pumping air is performed until the solder regions substantially solidify.

8. The method of claim 7, wherein the step of pumping air is started before the solder regions are molten.

9. The method of claim 7, wherein the thermal insulation layer is built under an upper portion of the vacuum boat, and wherein the upper portion of the vacuum boat receives the heat conducted from the package substrate strip.

10. The method of claim 7, wherein the step of reflowing is performed using a convection-type reflow process or an infrared (IR) heating process, with the vacuum boat being transferred on a conveyor belt during the step of reflowing.

11. A method comprising:
placing a package strip over a vacuum boat, wherein the vacuum boat comprises:
an air-penetration layer; a thermal insulation layer over the air-penetration layer, with a hole penetrating through the air-penetration layer and the thermal insulating layer, wherein the first package strip is in physical contact with the thermal insulation layer; an upper base portion underlying the air-penetrating layer; and a lower base portion underlying the upper base portion;

placing package components over the package strip;
melting solder regions between the package strip and the package components;
with the solder regions being molten, starting pumping air out of the vacuum boat, wherein the package strip is flattened; and
with the vacuum boat being pumped, allowing the molten solder regions to fully solidify.

12. The method of claim 11 further comprising transferring the vacuum boat, the package strip, and the package components using a conveyer belt during the melting the solder regions.

13. The method of claim 11, wherein the vacuuming boat has a plurality of through-holes, and the package strip covers the plurality of through-holes.

14. The method of claim 11, wherein the melting the solder regions comprises convection-type reflowing.

15. The method of claim 11, wherein the vacuum boat further comprises an air passage over the lower base portion and underlying the air-penetrating layer.

16. The method of claim 7, wherein the pumping air out of the plurality of holes is performed when the solder regions have been molten.

17. The method of claim 11, wherein the package strip comprises a plurality of package substrates, and the vacuum boat comprises a plurality of holes separated into a plurality of hole groups, wherein each of the hole groups is fully covered by one of the plurality of package substrates.

18. The method of claim 17, wherein the plurality of hole groups have inter-group spacings from each other, and holes in a same one of the plurality of hole groups have inner-group spacings smaller than the inter-group spacings.

19. The method of claim 1, wherein during the vacuuming the hole, the package strip seals the hole.

20. The method of claim 7, wherein when the air is pumped, the package substrate strip seals the plurality of holes.

* * * * *